(12) United States Patent
Brunn et al.

(10) Patent No.: US 7,091,773 B1
(45) Date of Patent: Aug. 15, 2006

(54) LIMITING CIRCUIT WITH LEVEL LIMITED FEEDBACK

(75) Inventors: Brian T. Brunn, Austin, TX (US); Michael A. Nix, Buda, TX (US)

(73) Assignee: Xilinx, Inc., San Jose, CA (US)

( * ) Notice: Subject to any disclaimer, the term of this patent is extended or adjusted under 35 U.S.C. 154(b) by 42 days.

(21) Appl. No.: 10/900,945

(22) Filed: Jul. 28, 2004

(51) Int. Cl.
*H03F 1/36* (2006.01)

(52) U.S. Cl. ......................................... 330/85; 330/260

(58) Field of Classification Search ................ 330/260, 330/253, 283, 85
See application file for complete search history.

(56) References Cited

U.S. PATENT DOCUMENTS

| | | | |
|---|---|---|---|
| 6,919,767 B1 * | 7/2005 | Mechnig et al. ............ | 330/253 |
| 6,927,631 B1 * | 8/2005 | Gupta et al. ................ | 330/260 |
| 2004/0022303 A1 * | 2/2004 | Tonietto et al. ............. | 375/219 |

* cited by examiner

*Primary Examiner*—Robert Pascal
*Assistant Examiner*—Hieu Nguyen
(74) *Attorney, Agent, or Firm*—Timothy W. Markison; Justin Liu (57) ABSTRACT

A limiting circuit includes an input transconductance stage, an output transconductance stage, a feedback transconductance stage, first and second resistive loads, and a level limiting circuit. The input transconductance stage is operably coupled to convert an input voltage signal into an input current signal. The first resistive load is operably coupled to convert the input current signal and a feedback current signal into an intermediate output voltage signal. The output transconductance stage is operably coupled to convert the intermediate output voltage signal into an output current signal. The second resistive load is operably coupled to convert the output current signal into an output voltage signal. The feedback transconductance stage is operably coupled to produce the feedback current signal based on the output voltage signal. The level limiting module is operably coupled to limit at least one voltage level of the feedback transconductance stage.

19 Claims, 8 Drawing Sheets limiting circuit 24

FIG. 1
programmable logic device 10

FIG. 2
MGT 20

FIG. 3
limiting circuit 24

FIG. 4
limiting circuit 24

FIG. 5
limiting circuit 24

FIG. 6
limiting circuit 24

LIMITING CIRCUIT WITH LEVEL LIMITED FEEDBACK

BACKGROUND OF THE INVENTION

1. Technical Field of the Invention

This invention relates generally to data communications and more particularly to limiting circuits within receivers of such data communications.

2. Description of Related Art

Communication systems are known to transport large amounts of data between a plurality of end user devices, which, for example, include telephones, facsimile machines, computers, television sets, cellular telephones, personal digital assistants, etc. As is also known, such communication systems may be local area networks (LANs) and/or wide area networks (WANs) that are stand-alone communication systems or interconnected to other LANs and/or WANs as part of a public switched telephone network (PSTN), packet switched data network (PSDN), integrated service digital network (ISDN), the Internet, etc. As is further known, communication systems include a plurality of system equipment to facilitate the transporting of data. Such system equipment includes, but is not limited to, routers, switches, bridges, gateways, protocol converters, frame relays, private branch exchanges, etc.

The transportation of data within communication systems is typically governed by one or more standards that ensure the integrity of data conveyances and fairness of access for data conveyances. For example, there are a variety of Ethernet standards that govern serial transmissions within a communication system at data rates of 10 megabits per second, 100 megabits per second, 1 gigabit per second and beyond. Another standard, which is for fiber optic data conveyances, is Synchronous Optical NETwork (SONET) that includes a hierarchy of data rates such as OC-3=155 Mbps, OC-12=644 Mbps, OC-48=2.488 Gbps, OC-192=9.952 Gbps, and OC-768=39.808 Gbps. In accordance with such standards, many system components and end user devices of a communication system transport data via serial transmission paths. Internally, however, the system components and end user devices process data in a parallel manner. As such, each system component and end user device must receive the serial data and convert the serial data into parallel data without loss of information.

To receive data, the system component includes a receiver section that may include an equalization module, a limiter, and a clock and data recovery module. As is known, the equalization module filters incoming serial data based on an equalization response, which typically corresponds to an inverse of the channel response of the channel on which the data was received. The limiter limits, on a bit-by-bit basis, the incoming data to one of the known states of the data symbol (e.g., a 1 or a 0 for a binary data symbol). The clock and data recovery module recovers a clock signal and data from the limited symbols produced by the limiter. The recovered data is then converted into a parallel data stream for subsequent processing.

One known implementation of a limiter is disclosed in a paper by Galal and Razavi, entitled, "10 Gb/s Limiting Amplifier and Laser/Modulator Driver in 0.18 μm CMOS Technology". Such a limiter works well in small signal applications. However, as signal magnitude increases, the feedback stage introduces distortion, in the form of jitter, due to severe reverse biasing of the gate-source voltages of its transistors. The introduced jitter reduces the receiver sensitivity, which limits the amount of data and/or the distance over which data can be transmitted.

Therefore, a need exists for a limiting circuit that includes a feedback stage with negligible introduction of jitter.

BRIEF SUMMARY OF THE INVENTION

The limiting circuit with level limited feedback of the present invention substantially meets these needs and others. In one embodiment, a limiting circuit includes an input transconductance stage, an output transconductance stage, a feedback transconductance stage, first and second resistive loads, and a level limiting circuit. The input transconductance stage is operably coupled to convert an input voltage signal into an input current signal. The first resistive load is operably coupled to convert the input current signal and a feedback current signal into an intermediate output voltage signal. The output transconductance stage is operably coupled to convert the intermediate output voltage signal into an output current signal. The second resistive load is operably coupled to convert the output current signal into an output voltage signal. The feedback transconductance stage is operably coupled to produce the feedback current signal based on the output voltage signal. The level limiting module is operably coupled to limit at least one voltage level of the feedback transconductance stage.

In another embodiment, a multi-stage limiting circuit includes a plurality of limiting circuits operably coupled in a cascaded manner. Each of the plurality of limiting circuits includes an input transconductance stage, an output transconductance stage, a feedback transconductance stage, and first and second resistive loads. The input transconductance stage is operably coupled to convert an input voltage signal into an input current signal. The first resistive load is operably coupled to convert the input current signal and a feedback current signal into an intermediate output voltage signal. The output transconductance stage is operably coupled to convert the intermediate output voltage signal into an output current signal. The second resistive load is operably coupled to convert the output current signal into an output voltage signal. The feedback transconductance stage is operably coupled to produce the feedback current signal based on the output voltage signal. At least one of the plurality of limiting circuits further includes a level limiting module operably coupled to limit at least one voltage level of the feedback transconductance stage of the at least one of the plurality of limiting circuits.

In yet another embodiment, a receiver includes an equalizing module, a limiting circuit, and a clock and data recovery module. The equalizing module is operably coupled to equalize a serial stream of data to produce an equalized serial stream of data. The limiting circuit is operably coupled to limit the equalized serial stream of data to produce a limited stream of data. The clock and data recovery module is operably coupled to produce a recovered clock and recovered data from the limited stream of data. The limiting circuit includes an input transconductance stage, an output transconductance stage, a feedback transconductance stage, first and second resistive loads, and a level limiting circuit. The input transconductance stage is operably coupled to convert an input voltage signal into an input current signal. The first resistive load is operably coupled to convert the input current signal and a feedback current signal into an intermediate output voltage signal. The output transconductance stage is operably coupled to convert the intermediate output voltage signal into an output current signal. The second resistive load is operably coupled to convert the output current signal into an output voltage signal. The feedback transconductance stage is operably coupled to produce the feedback current signal based on the output voltage signal. The level limiting module is operably coupled to limit at least one voltage level of the feedback transconductance stage.

DETAILED DESCRIPTION OF THE INVENTION

Figure 1:
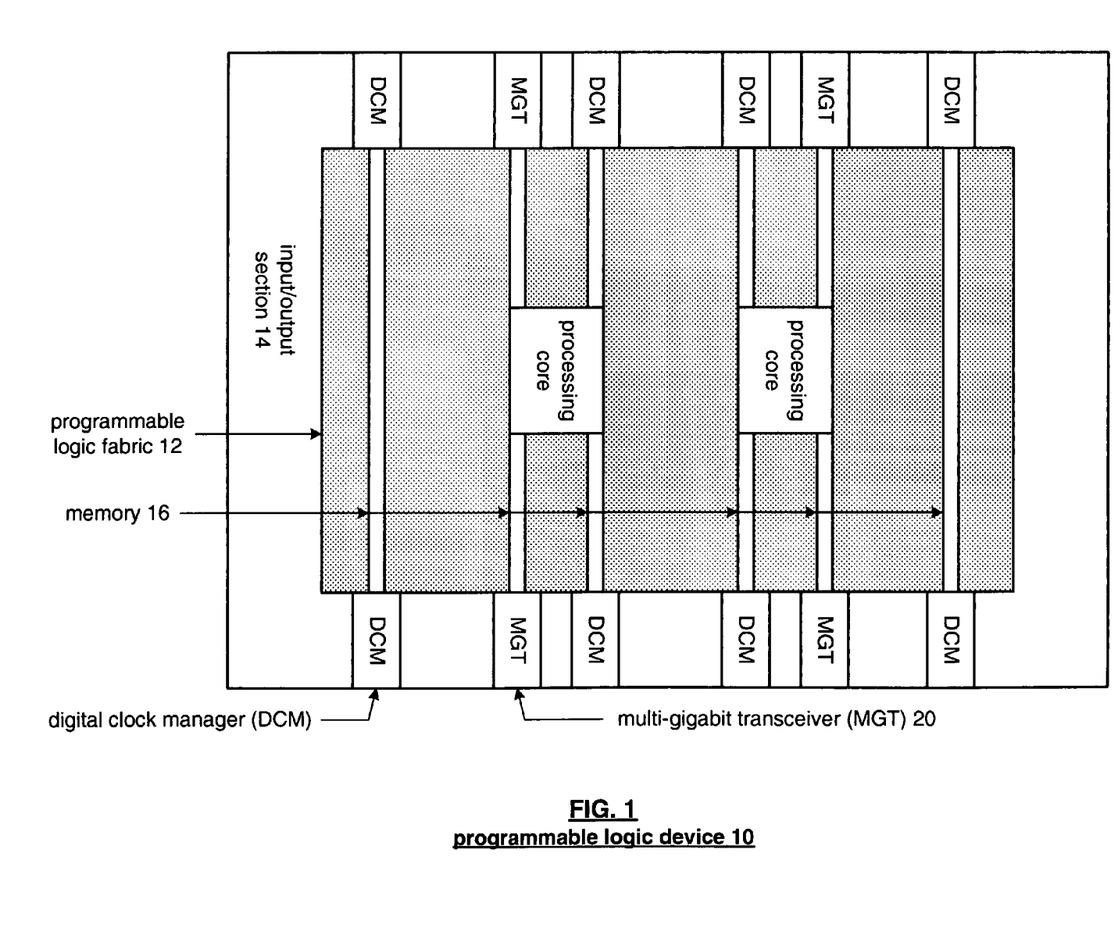
FIG. 1 is a schematic block diagram of a programmable logic device that includes programmable logic fabric, an input/output section, and memory.

FIG. 1 is a schematic block diagram of a programmable logic device 10 that includes programmable logic fabric 12, an input/output section 14, and memory 16. The programmable logic fabric 12 may include one or more processing cores and programmable logic circuitry. Such programmable logic circuitry may include programmable logic arrays (PLAs), programmable array logic (PAL) devices, erasable programmable logic devices (EPLDs) and/or programmable gate arrays (PGAs). Memory 16 may be block random access memory (BRAM). Input/output section 14 may include a plurality of digital clock managers (DCMs) and a plurality of multi-gigabit transceivers (MGTs). Other programmable logic device embodiments may include other configurable resources in other configurations. An example of an alternate embodiment is described in U.S. patent application Ser. No. 10/683,944, entitled "Columnar Architecture" by Young, filed on Oct. 10, 2003, and incorporated herein in its entirety.

The digital clock managers provide various clock signals to the programmable logic fabric 12 and may further provide clock signals to the multi-gigabit transceivers. The multi-gigabit transceivers provide digital interfaces for the programmable logic fabric 12 to exchange data with components external to the programmable logic device 10. In general, the multi-gigabit transceivers provide serial-to-parallel conversion of received serial data and provide parallel-to-serial conversion for outgoing data. Further, the digital clock managers may provide clock signals, for example, to memory, or other input/output modules, for double data rate and quad data rate accesses.

Figure 2:
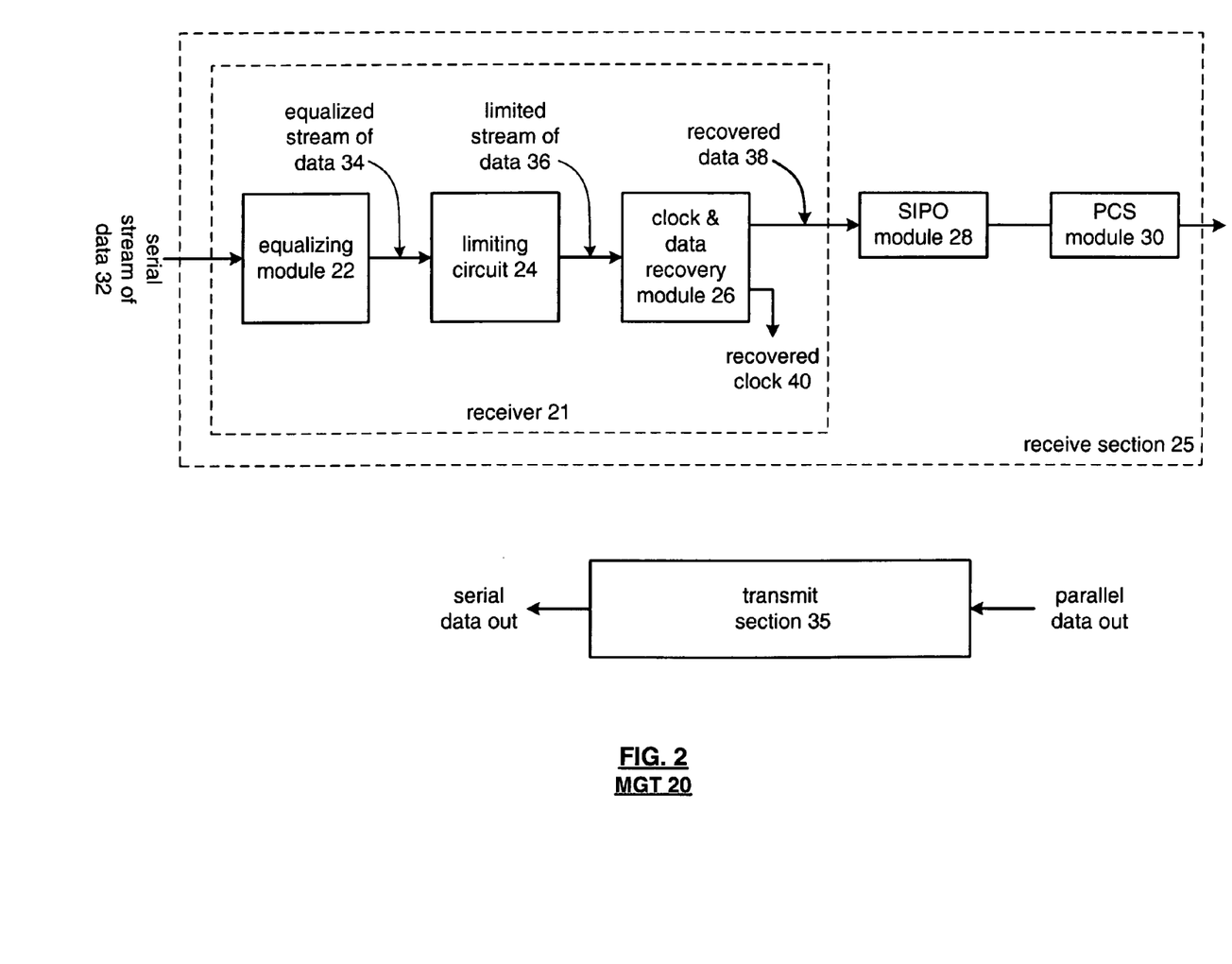
FIG. 2 is a functional block diagram of a multi-gigabit transceiver according to one embodiment of the present invention.

FIG. 2 is a functional block diagram of a multi-gigabit transceiver (MGT) 20 according to one embodiment of the present invention. MGT 20 includes a transmit section 35 operably coupled to receive parallel data out to produce serial data out, and a receive section 25. Receive section 25 includes a receiver 21, a serial-input-parallel-output (SIPO) module 28, and a physical coding sub-layer (PCS) module 30. Receiver 21 includes an equalizing module 22, a limiting circuit 24, and a clock and data recovery (CDR) module 26.

In operation, MGT 20 receives a serial stream of data 32 over a communications channel including at least one of a copper cable, a printed circuit board trace or other wired connection. In some embodiments, one or more portions of the communications channel may also comprise wireless connections. The communications channel's amplitude response should be constant and the phase response should be linear over the bandwidth including the serial stream of data 32. Typically, however, the communications channel introduces frequency dependent attenuation as a result of amplitude and phase distortion due to the skin effect in conductors and dielectric absorption in the insulating material of the cabling. This distortion results in a spreading or smearing of individual pulses or bits of the serial stream of data such that individual bits are not well-defined resulting in inter-symbol interference. Equalization at the receiver end of the communications channel uses at least one of signal processing or filtering to compensate for the distortion introduced by the communications channel. Thus, equalizing module 22 is operably coupled to equalize the serial stream of data 32 to produce an equalized stream of data 34. Limiting circuit 24 is operably coupled to limit the equalized stream of data 34 to produce a limited stream of data 36. As will be discussed with respect to the following figures, limiting circuit 24 amplifies the equalized stream of data 34 to produce a logic one or a logic zero. CDR module 26 is operably coupled to produce recover data 38 and clock 40 from the limited stream of data 36.

The SIPO module 28, of receive section 25, converts the recovered data 38 into parallel data based on deserialization settings received from the processing core of programmable logic device 10. The deserialization settings may include the rate of the serial data, the desired rate of the receiver parallel data path and the width of the parallel data path. PCS module 30 is operably coupled to produce receive data words from the parallel data based on a desired word size.

Transmit section 35 is operably coupled to convert transmit parallel data out into serial data out based on settings received from the processing core of programmable logic device 10. The settings may indicate, for example, the width and the rate of the parallel data out.

Figure 3:
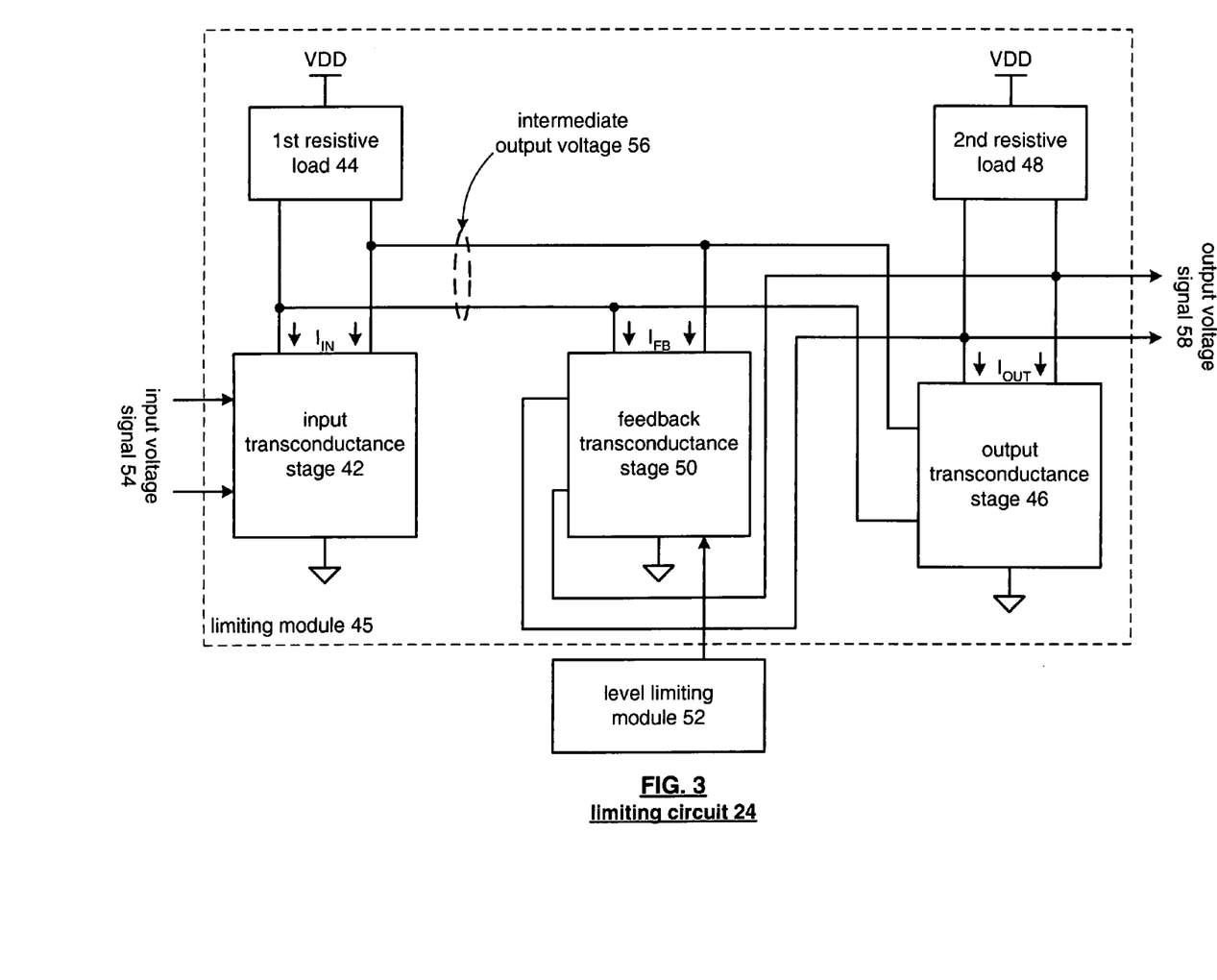
FIG. 3 is a functional block diagram of a limiting circuit according to one embodiment of the present invention.

FIG. 3 is a functional block diagram of limiting circuit 24 according to one embodiment of the present invention. Limiting circuit 24 includes a limiting module 45 and a level limiting module 52. Limiting module 45 includes an input transconductance stage 42, a first resistive load 44, an output transconductance stage 46, a second resistive load 48, and a feedback transconductance stage 50.

In operation, limiting module 45 is operably coupled to receive input voltage signal 54 and to produce output voltage signal 58 wherein output voltage signal 58 represents the limited stream of data 36 of FIG. 2, limited on a bit-by-bit basis.

Input transconductance stage 42 is operably coupled to convert input voltage signal 54 to an input current coupled to first resistive load 44. The voltage developed across first resistive load 44 is operably coupled to output transconductance stage 46 as intermediate output voltage signal 56.

Output transconductance stage 46 is operably coupled to convert intermediate output voltage signal 56 to an output current operably coupled to a second resistive load 48 to produce output voltage signal 58. Input transconductance stage 42 and output transconductance stage 46 amplify input voltage signal 54 to square up the signal so the clock and data recovery module (CDR module 26 of FIG. 2) can reliably recover the clock and data information from output voltage signal 58. Output voltage signal 58 is further coupled to feedback transconductance stage 50.

Feedback transconductance stage 50 provides negative feedback to increase the frequency response of limiting module 45. Level limiting module 52 is operably coupled to feedback transconductance stage 50 to limit at least one voltage level of feedback transconductance stage 50. Without level limiting module 52, the high gain of output transconductance stage 46 and resulting large voltage swings of output voltage signal 58 causes a reverse bias on an input of feedback transconductance stage 50. The operation of level limiting module 52 will be more fully described with respect to FIGS. 6–9.

Figure 4:
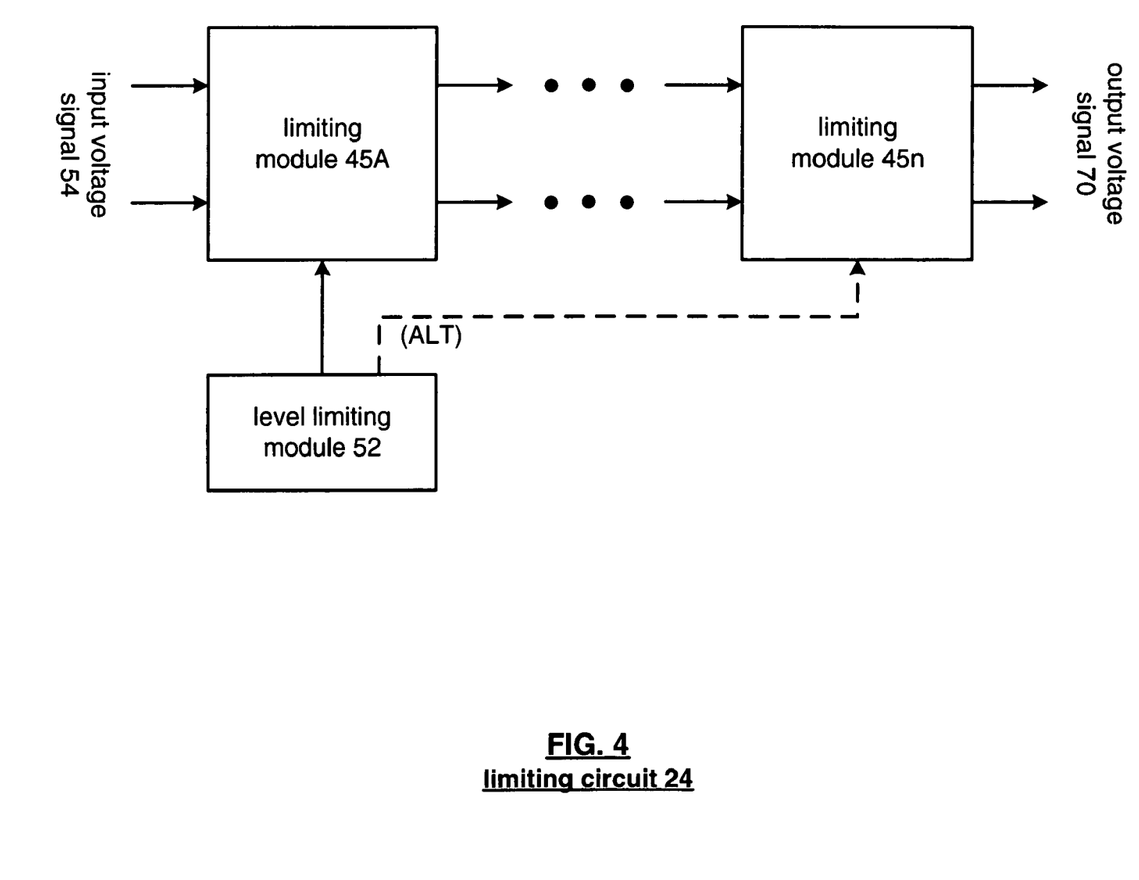
FIG. 4 is a functional block diagram of a multi-stage limiting circuit according to one embodiment of the present invention.

FIG. 4 is a functional block diagram of a multi-stage limiting circuit according to one embodiment of the present invention. Multi-stage limiting circuit 24 includes a plurality of limiting modules, namely limiting modules 45A–45N, coupled in a cascade manner. Multi-stage limiting circuit 24 further includes level limiting module 52 coupled to at least one limiting module within multi-stage limiting circuit 24, wherein level limiting module 52 limits at least one voltage level within the at least one limiting module. The at least one limiting module is operably coupled to input voltage signal 54 to produce output voltage signal 70. In an alternate embodiment of the present invention, each limiting module of the plurality of limiting modules includes the level limiting module.

Figure 5:
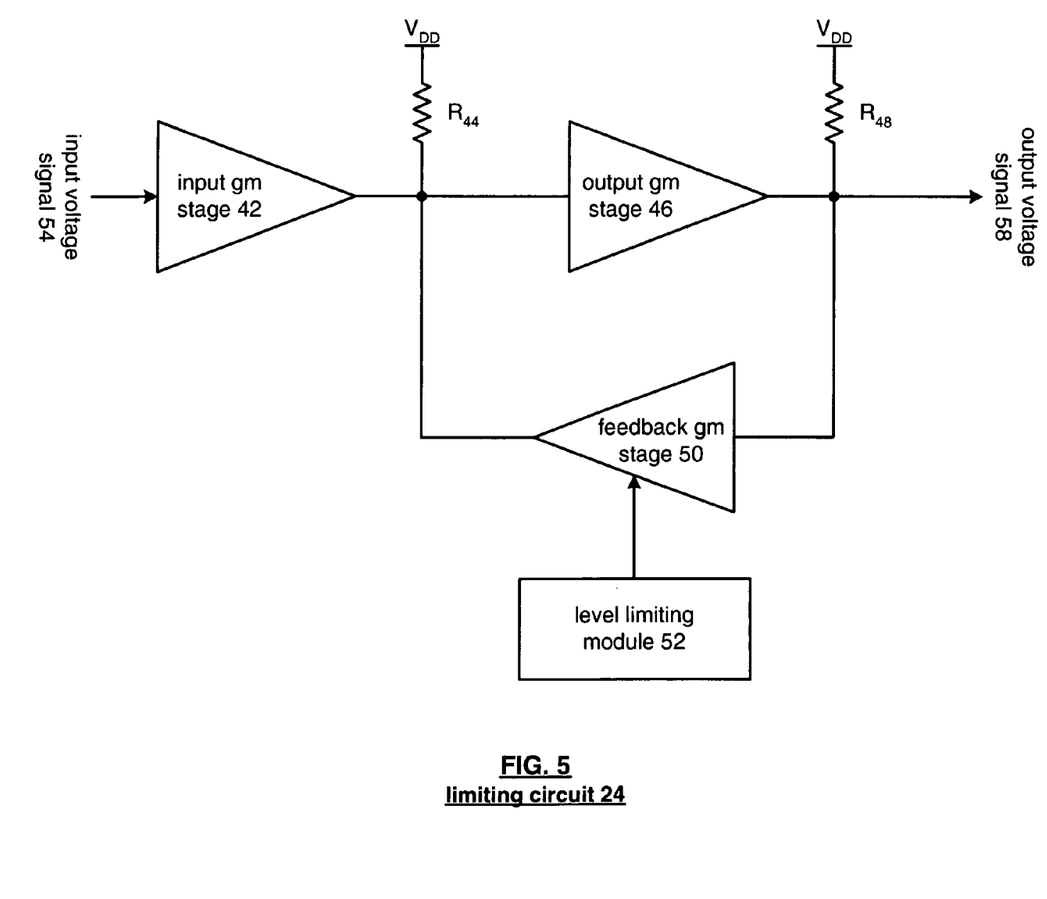
FIG. 5 is a functional block diagram of a single-ended embodiment of a limiting circuit.

FIG. 5 is a functional block diagram of a single-ended embodiment of limiting circuit 24. Limiting circuit 24 includes an input transconductance (gm) stage 42, a first resistive load 44, an output gm stage 46, a second resistive load 48, and a feedback gm stage 50.

In operation, input transconductance stage 42 is operably coupled to receive input voltage signal 54 and produces an input current signal to first resistive load 44. First resistive load 44 converts the input current signal and a feedback current signal into an intermediate output voltage signal. Output transconductance stage 46 is operably coupled to convert the intermediate output voltage signal into an output current signal coupled to second resistive load 48 to produce output voltage signal 58. Output voltage signal 58 is coupled to downstream components, such as clock and data recovery module 26 (CDR module 26 of FIG. 2) and to feedback transconductance stage 50. Feedback transconductance stage 50 is operably coupled to produce the feedback current signal based on the output voltage signal 58. Level limiting module 52 is operably coupled to feedback transconductance stage 50 to limit at least one voltage level of feedback transconductance stage 50. The single-ended embodiment of FIG. 5 is functionally equivalent to the differential embodiment of FIG. 3 wherein level limiting module 52 limits the reverse bias on an input of feedback transconductance stage 50 thereby substantially reducing intersymbol interference.

Figure 6:
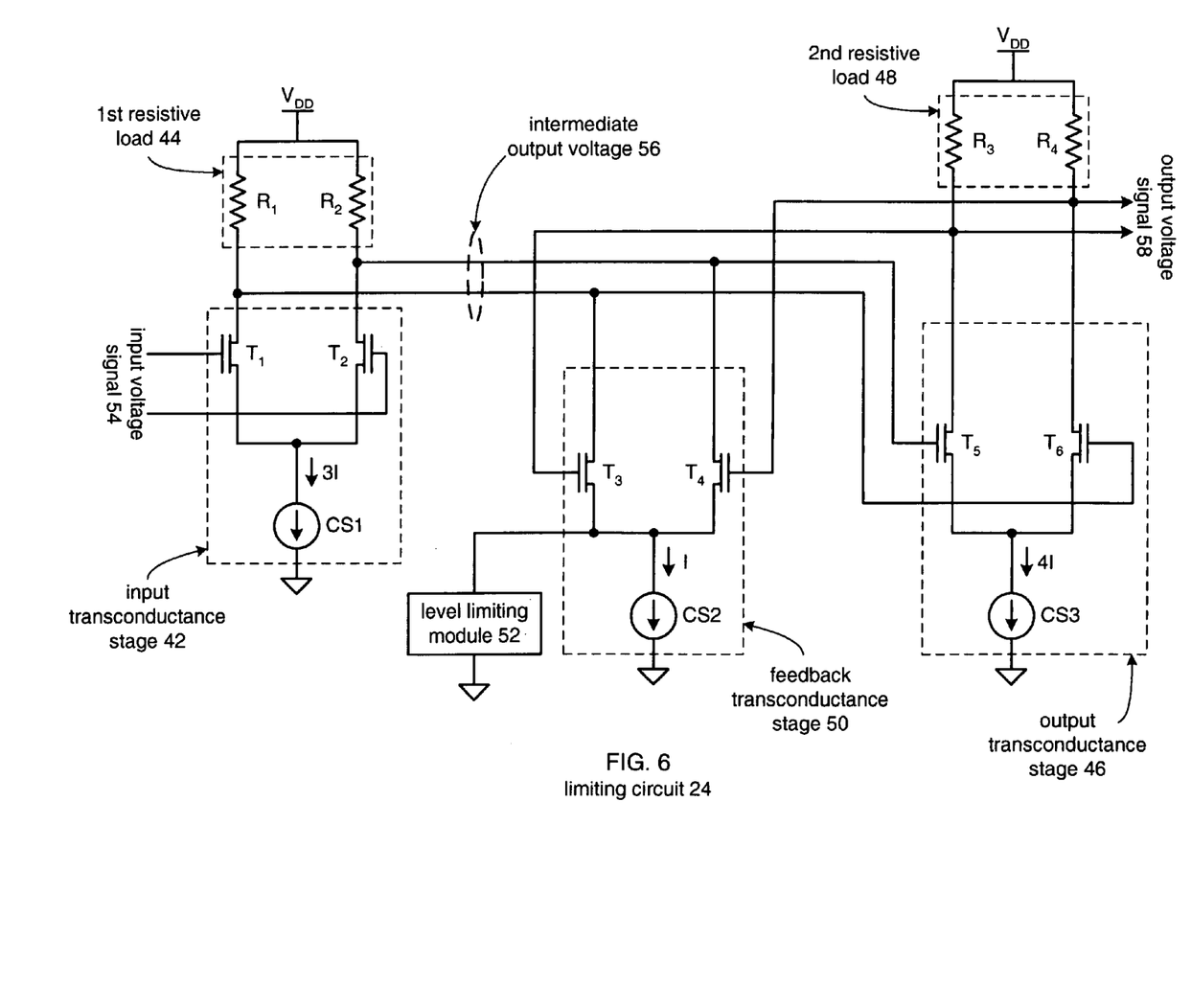
FIG. 6 is a schematic block diagram of a limiting circuit according to one embodiment of the present invention.

FIG. 6 is a schematic block diagram of limiting circuit 24 according to one embodiment of the present invention. Limiting circuit 24 includes an input transconductance stage 42, a first resistive load 44, an output transconductance stage 46, a second resistive load 48, a feedback transconductance stage 50, and a level limiting module 52.

The input transconductance stage 42 includes a first differential transistor pair T1 and T2 operably coupled to convert input voltage signal 54 into an input current signal coupled to first resistive load 44 including resistive elements R1 and R2. A first current sink CS1 is operably coupled to sink current (3I) from the first differential transistor pair T1 and T2. The intermediate output voltage signal 56 voltage developed across first resistive load 44 is operably coupled to the output transconductance stage 46.

Output transconductance stage 46 includes a third differential transistor pair T5 and T6 operably coupled to receive intermediate output voltage signal 56 and operably coupled to the second resistive load 48 including resistive elements R3 and R4. A third current sink CS3 is operably coupled to sink current (4I) from the third differential transistor pair T5 and T6. As intermediate output voltage signal 56 changes magnitude in response to input voltage signal 54, the output current produced by output transconductance stage 46 causes output voltage signal 58 to swing from $V_{DD}$ to $V_{DD}-4I*R_{load}$ (may be as low as approximately zero volts). The voltage developed across second resistive load 48 is operably coupled to output voltage signal 58 to downstream components and to feedback transconductance stage 50.

Feedback transconductance stage 50 includes a second differential transistor pair T3 and T4 operably coupled to first resistive load 44. A second current sink CS2 is operably coupled to sink current (I) from the second differential transistor pair T3 and T4. Output voltage signal 58, operably coupled to transistors T3 and T4, provides active shunt—shunt feedback to provide the gain-bandwidth product to amplify high-speed serial data.

Level limiting module 52, operably coupled to at least one of the second differential transistor pair T3 and T4 and the second current sink CS2, limits reverse biasing of the gate-source voltage of the second differential transistor pair T3 and T4. Without level limiting module 52, a sequence of identical bit values of input voltage signal 54 causes the source voltage on the second differential transistor pair T3 and T4 to rise to a voltage level approximately equal to $V_{DD}-I*R_{load}$ while the gate voltage on one of transistor T3 or transistor T4 drops to $V_{DD}-4I*R_{load}$. The resulting reverse bias gate-source voltage of $-3I*R_{load}$ must be overcome when the state of the input changes (e.g. zero to one or one to zero) which cannot be done instantaneously due to the parasitic capacitance of the transistors. The time delay from a reverse biased condition to an operational condition causes jitter and inter-symbol interference (ISI) in the output voltage signal 58. But with level limiting circuit 52 the source voltage is limited to a level that substantially reduces the reverse bias level of the OFF transistor.

Figure 7:
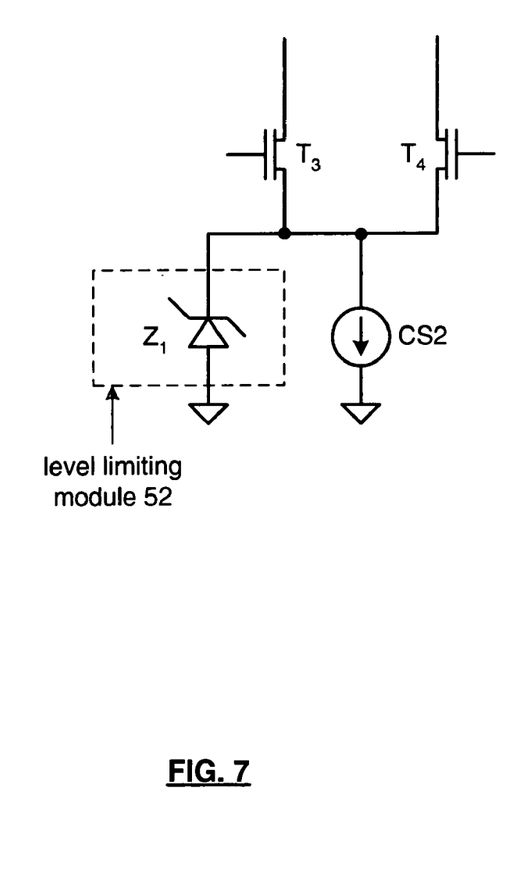
FIG. 7 is a schematic block diagram of feedback transconductance stage 50 and level limiting module 52 according to one embodiment of the present invention.

FIG. 7 is a schematic block diagram of feedback transconductance stage 50 and level limiting module 52 according to one embodiment. In this embodiment, the level limiting module 52 includes a zener diode Z1 operably coupled in parallel with second current sink CS2. As is known to one of average skill in the art, zener diode Z1 will not conduct appreciable current until the second differential transistor pair T3 and T4 source voltage reaches the zener voltage or breakdown voltage. At that point, the zener diode conducts current to maintain the source voltage substantially equal to the zener voltage. In the embodiment of FIG. 7, the zener voltage is selected to limit the second differential transistor pair T3 and T4 source voltage such that the gate-source voltage is not as negatively biased thereby substantially reducing the jitter caused by the delay in returning transistor T3 or T4 into operation.

Figure 8:
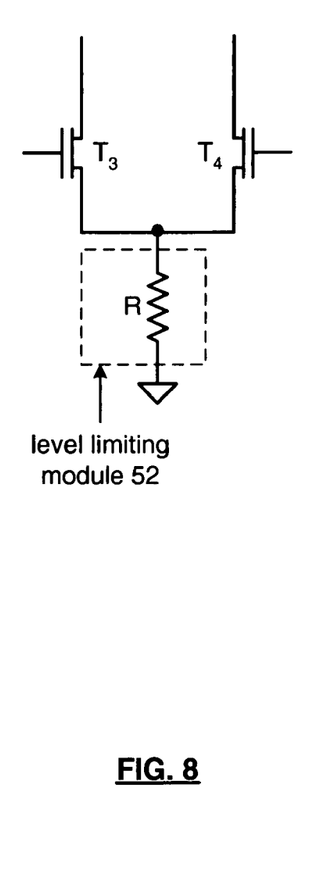
FIG. 8 is a schematic block diagram of feedback transconductance stage 50 and level limiting module 52 according to an alternate embodiment of the present invention.

FIG. 8 is a schematic block diagram of the feedback transconductance stage 50 and level limiting module 52 according to an alternate embodiment. In this embodiment, the level limiting module 52 includes a resistor R operably coupled to replace current sink CS2. The resistance of resistor R is selected to match the desired current sink value when the differential outputs are equal. When the differential outputs separate (as will happen when either bit state has been determined), this resistor will limit the second differential transistor pair T3 and T4 source voltage such that the gate-source voltage is not as negatively biased. As is known to one of average skill in the art, resistor R may be one of a resistive element or a transistor biased in the triode region.

Figure 9:
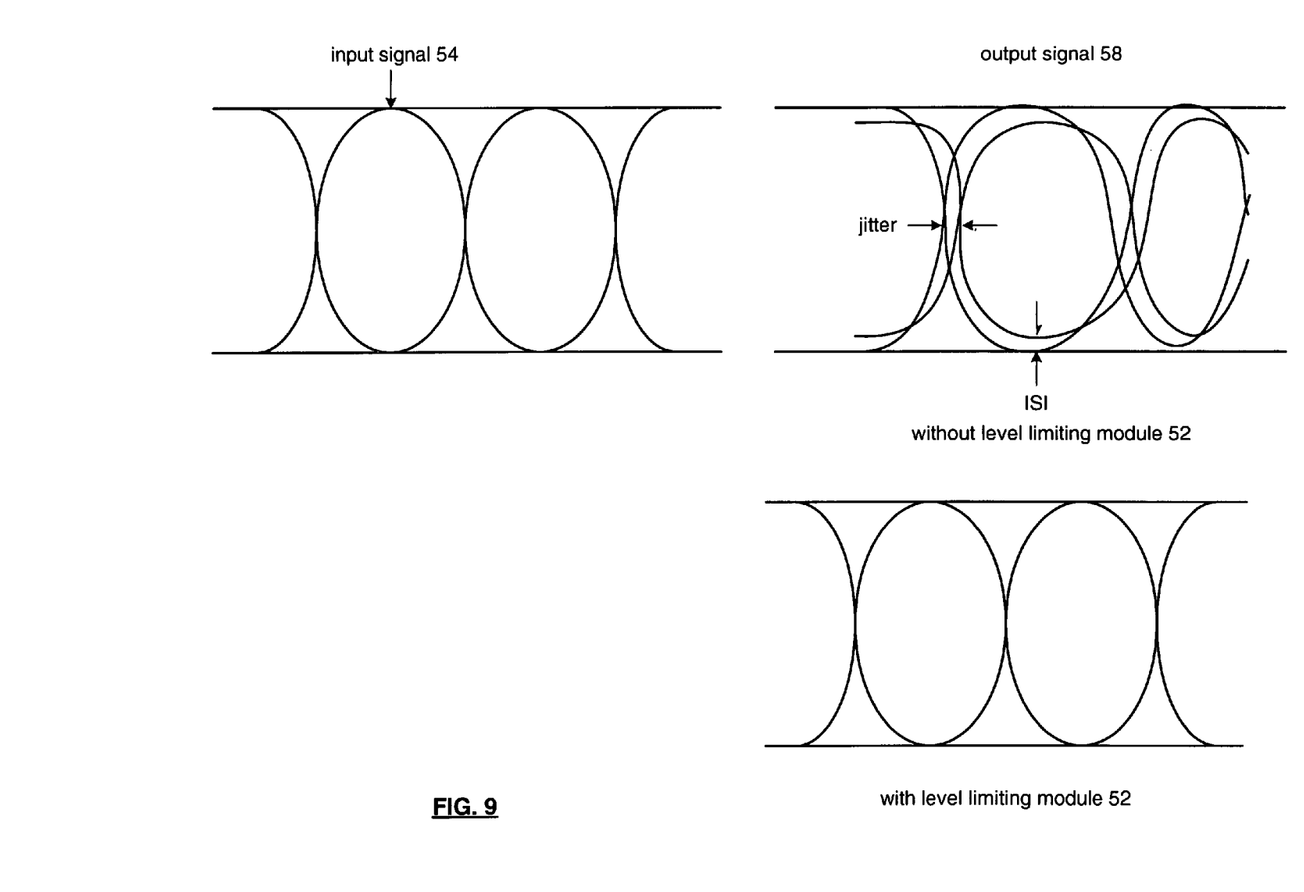
FIG. 9 illustrates an output signal with and without a level limiting module.

FIG. 9 illustrates input and output signals with and without a level limiting module. As can be seen, output voltage signal 58, based on input voltage signal 54, has significant jitter and ISI due to the delay and attenuation introduced by feedback transconductance stage 50 when the second differential transistor pair T3 and T4 gate-source voltage is significantly reversed biased. The variance in timing and signal amplitude produce jitter and ISI in the eye diagram as is known to one of average skill in the art. The eye diagram illustrates the timing variance or jitter due to the time delay required to remove the gate-source reverse bias on the differential transistor pair of feedback transconductance stage 50. Additionally, the reduction in output voltage swing introduces ISI into output voltage signal 58.

As is also illustrated, output voltage signal 58 with level limiting module 52 functions as previously described to limit the reverse bias on the differential transistor pair of the feedback transconductance stage.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The preceding discussion has presented a limiting circuit with level limited feedback such that introduced jitter by the feedback stage is negligible. As one of average skill in the art will appreciate, other embodiments may be derived from the teachings of the present invention without deviating from the scope of the claims.

What is claimed is:

1. A limiting circuit comprises:
   an input transconductance stage operably coupled to convert an input voltage signal into an input current signal;
   a first resistive load operably coupled to convert the input current signal and a feedback current signal into an intermediate output voltage signal;
   an output transconductance stage operably coupled to convert the intermediate output voltage signal into an output current signal;
   a second resistive load operably coupled to convert the output current signal into an output voltage signal;
   a feedback transconductance stage operably coupled to produce the feedback current signal based on the output voltage signal; and
   a level limiting module operably coupled to limit at least one voltage level of the feedback transconductance stage;
   wherein:
   the input transconductance stage includes:
      a first differential transistor pair operably coupled to receive the input voltage signal and operably coupled to the first resistive load; and
      a first current sink operably coupled to sink current from the first differential transistor pair;
   the feedback transconductance stage includes:
      a second differential transistor pair operably coupled to receive the output voltage signal and operably coupled to the first resistive load; and
      a second current sink operably coupled to sink current from the second differential transistor pair, wherein the level limiting module is operably coupled to at least one of the second differential transistor pair and the second current sink; and
   the output transconductance stage includes:
      a third differential transistor pair operably coupled to receive the intermediate output voltage signal and operably coupled to the second resistive load; and
      a third current sink operably coupled to sink current from the third differential transistor pair.

2. The limiting circuit of claim 1, wherein the level limiting module functions to:
   limit reverse biasing of gate-source voltage of the second differential transistor pair.

3. The limiting circuit of claim 1, wherein the level limiting module comprises:
   a source voltage limiting circuit operably coupled in parallel with the second current sink.

4. The limiting circuit of claim 3, wherein the source voltage limiting circuit comprises at least one of: a zener diode, a resistor, and a transistor.

5. The limiting circuit of claim 1, wherein the level limiting module comprises:
   a source voltage limiting circuit operably coupled to replace the second current sink.

6. The limiting circuit of claim 5, wherein the source voltage limiting circuit comprises at least one of: a zener diode, a resistor, and a transistor.

7. A multi-stage limiting circuit comprises:
   a plurality of limiting circuits operably coupled in a cascaded manner, wherein each of the plurality of limiting circuits includes:
      an input transconductance stage operably coupled to convert an input voltage signal into an input current signal;
      a first resistive load operably coupled to convert the input current signal and a feedback current signal into an intermediate output voltage signal;

an output transconductance stage operably coupled to convert the intermediate output voltage signal into an output current signal;
a second resistive load operably coupled to convert the output current signal into an output voltage signal; and
a feedback transconductance stage operably coupled to produce the feedback current signal based on the output voltage signal;
wherein at least one of the plurality of limiting circuits further includes a level limiting module operably coupled to limit at least one voltage level of the feedback transconductance stage of the at least one of the plurality of limiting circuits; and
wherein:
the input transconductance stage of each of the plurality of limiting circuits includes:
a first differential transistor pair operably coupled to receive the input voltage signal and operably coupled to the first resistive load; and
a first current sink operably coupled to sink current from the first differential transistor pair;
the feedback transconductance stage of each of the plurality of limiting circuits includes:
a second differential transistor pair operably coupled to receive the output voltage signal and operably coupled to the first resistive load; and
a second current sink operably coupled to sink current from the second differential transistor pair, wherein the level limiting module is operably coupled to at least one of the second differential transistor pair and the second current sink; and
the output transconductance stage of each of the plurality of limiting circuits includes:
a third differential transistor pair operably coupled to receive the intermediate output voltage signal and operably coupled to the second resistive load; and
a third current sink operably coupled to sink current from the third differential transistor pair.

8. The multi-stage limiting circuit of claim 7, wherein the level limiting module functions to:
limit reverse biasing of gate-source voltage of the second differential transistor pair of the at least one of the plurality of limiting circuits.

9. The multi-stage limiting circuit of claim 7, wherein the level limiting module comprises:
a source voltage limiting circuit operably coupled in parallel with the second current sink of the at least one of the plurality of limiting circuits.

10. The multi-stage limiting circuit of claim 9, wherein the source voltage limiting circuit comprises at least one of: a zener diode, a resistor, and a transistor.

11. The multi-stage limiting circuit of claim 7, wherein the level limiting module comprises:
a source voltage limiting circuit operably coupled to replace the second current sink of the at least one of the plurality of limiting circuits.

12. The multi-stage limiting circuit of claim 11, wherein the source voltage limiting circuit comprises at least one of: a zener diode, a resistor, and a transistor.

13. The multi-stage limiting circuit of claim 7 wherein:
each of the plurality of limiting circuits further includes the level limiting module.

14. A receiver comprises:
an equalizing module operably coupled to equalize a serial stream of data to produce an equalized serial stream of data;
a limiting circuit operably coupled to limit the equalized serial stream of data to produce a limited stream of data; and
a clock and data recovery module operably coupled to produce a recovered clock and recovered data from the limited stream of data, wherein the limiting circuit includes:
an input transconductance stage operably coupled to convert an input voltage signal into an input current signal;
a first resistive load operably coupled to convert the input current signal and a feedback current signal into an intermediate output voltage signal;
an output transconductance stage operably coupled to convert the intermediate output voltage signal into an output current signal;
a second resistive load operably coupled to convert the output current signal into an output voltage signal;
a feedback transconductance stage operably coupled to produce the feedback current signal based on the output voltage signal; and
a level limiting module operably coupled to limit at least one voltage level of the feedback transconductance stage;
wherein:
the input transconductance stage includes:
a first differential transistor pair operably coupled to receive the input voltage signal and operably coupled to the first resistive load; and
a first current sink operably coupled to sink current from the first differential transistor pair;
the feedback transconductance stage includes:
a second differential transistor pair operably coupled to receive the output voltage signal and operably coupled to the first resistive load; and
a second current sink operably coupled to sink current from the second differential transistor pair, wherein the level limiting module is operably coupled to at least one of the second differential transistor pair and the second current sink; and
the output transconductance stage includes:
a third differential transistor pair operably coupled to receive the intermediate output voltage signal and operably coupled to the second resistive load; and
a third current sink operably coupled to sink current from the third differential transistor pair.

15. The receiver of claim 14, wherein the level limiting module functions to:
limit reverse biasing of gate-source voltage of the second differential transistor pair.

16. The receiver of claim 14, wherein the level limiting module comprises:
a source voltage limiting circuit operably coupled in parallel with the second current sink.

17. The receiver of claim 16, wherein the source voltage limiting circuit comprises at least one of: a zener diode, a resistor, and a transistor.

18. The receiver of claim 14, wherein the level limiting module comprises:
a source voltage limiting circuit operably coupled to replace the second current sink.

19. The receiver of claim 18, wherein the source voltage limiting circuit comprises at least one of: a zener diode, a resistor, and a transistor.

* * * * *